United States Patent [19]
[11] 3,882,733
[45] May 13, 1975
Fukui et al.

[54] FINE TUNING SHAFT FOR TV TUNER

[75] Inventors: Kanji Fukui; Akira Otsuki, both of Kakuda, Japan

[73] Assignee: Alps Electric Co., Ltd., Tokyo, Japan

[22] Filed: Jan. 21, 1974

[21] Appl. No.: 434,789

[30] Foreign Application Priority Data

Jan. 30, 1973 Japan ............................ 48-13265

[52] U.S. Cl. ..................... 74/10.54; 64/11 R; 64/14; 64/27 NM; 74/10.85; 64/1 V

[51] Int. Cl. ............................................ F16h 35/18

[58] Field of Search ............ 74/10.54, 10.45, 10.52, 74/10 R, 10.8, 10.41, 409; 64/14, 1 V, 1 R, 27 NM, 11 R, 27 R; 73/522, 526

[56] References Cited

UNITED STATES PATENTS

| | | | |
|---|---|---|---|
| 2,620,640 | 12/1952 | Bales | 64/14 |
| 3,046,759 | 7/1962 | Deford et al. | 64/11 R |
| 3,363,435 | 1/1968 | Crow | 64/27 NM |
| 3,554,044 | 1/1971 | Hoglund | 74/409 |
| 3,797,322 | 3/1974 | Miner | 74/10.54 |
| 3,828,613 | 8/1974 | Streddo | 74/10.85 |

*Primary Examiner*—Samuel Scott
*Assistant Examiner*—Randall Heald

[57] ABSTRACT

In TV tuners where the coarse tuning shaft and the fine tuning shaft are mechanically interrelated, there is a tendency for the setting of the fine tuning shaft to change when the coarse tuning shaft is turned. This tendency is prevented or greatly minimized by dividing the fine tuning shaft into two sections, one directly driven by the fine tuning knob and the other directly driving the tuning element, and providing between those two sections a resilient cushion member which takes up inertial shock and restores the fine tuning shaft to its previous position relative to the coarse tuning shaft.

12 Claims, 3 Drawing Figures

FINE TUNING SHAFT FOR TV TUNER

BACKGROUND OF THE INVENTION

In many TV tuners, and particularly those of the UHF type, a fine tuning shaft and a coarse tuning shaft are both drivingly connected to the tuning element at all times. Usually the fine tuning shaft is coaxially mounted on the coarse tuning shaft. Hence when the coarse tuning shaft is moved to tune the set from one channel to another, the fine tuning shaft is likewise rotated. Optimally, the rotation of the fine tuning shaft should be such, relative to the coarse tuning shaft, as not to change the quantum of additional tuning that the fine tuning shaft has introduced into the set. However, because of frictional and inertial effects, particularly arising from the rapid changes of speed of movement of the coarse tuning shaft during tuning, especially when, as is often the case, the coarse or channel tuning is detented, it often occurs that the fine tuning shaft does not keep pace with the coarse tuning shaft, thus giving rise to slight dislocation of the fine tuning which must be compensated for by manual adjustment of the fine tuning shaft. Obviously, this necessity for fine tuning shaft adjustment each time that a new channel is selected is a source of irritation to the user of the set, and hence a drawback to the tuning system.

It is an object of the present invention to provide a TV tuner in which the tendency of the fine tuning shaft to shift its position relative to the coarse tuning shaft when the coarse tuning is actuated is eliminated or greatly minimized.

It is another object of the present invention to provide a TV tuner in which the above objective is achieved in a simple and inexpensive manner, one easily incorporated into existing tuner configurations, and one which will require little or no repair or maintenance.

SUMMARY OF THE INVENTION

According to the present invention, the fine tuning shaft is divided into two sections, one driven by the fine tuning knob and the other driving the tuning element. Interposed between those two sections in driving relationship is a cushion member formed of resilient material, that cushion member coupling the two sections together to form a unitary shaft structure and permitting rotation of the first section to be transmitted to the second section, thereby to effect fine tuning. The cushion member further absorbs inertial effects, thereby to eliminate relative positional offset between the fine tuning shaft and the coarse tuning shaft. (Here, as elsewhere in this specification, the term "coarse tuning shaft" includes what is commonly termed a channel selector shaft, effecting tuning between one selected TV channel and another, while the term "fine tuning shaft" includes a manually actuatable element effective to adjust the tuning for a particular channel so that optimum reception results. The term "shaft" is used in a generic sense, including not only a rotatable element but also a translatable or pivotal element.)

DESCRIPTION OF THE PREFERRED EMBODIMENT

Figure 1:
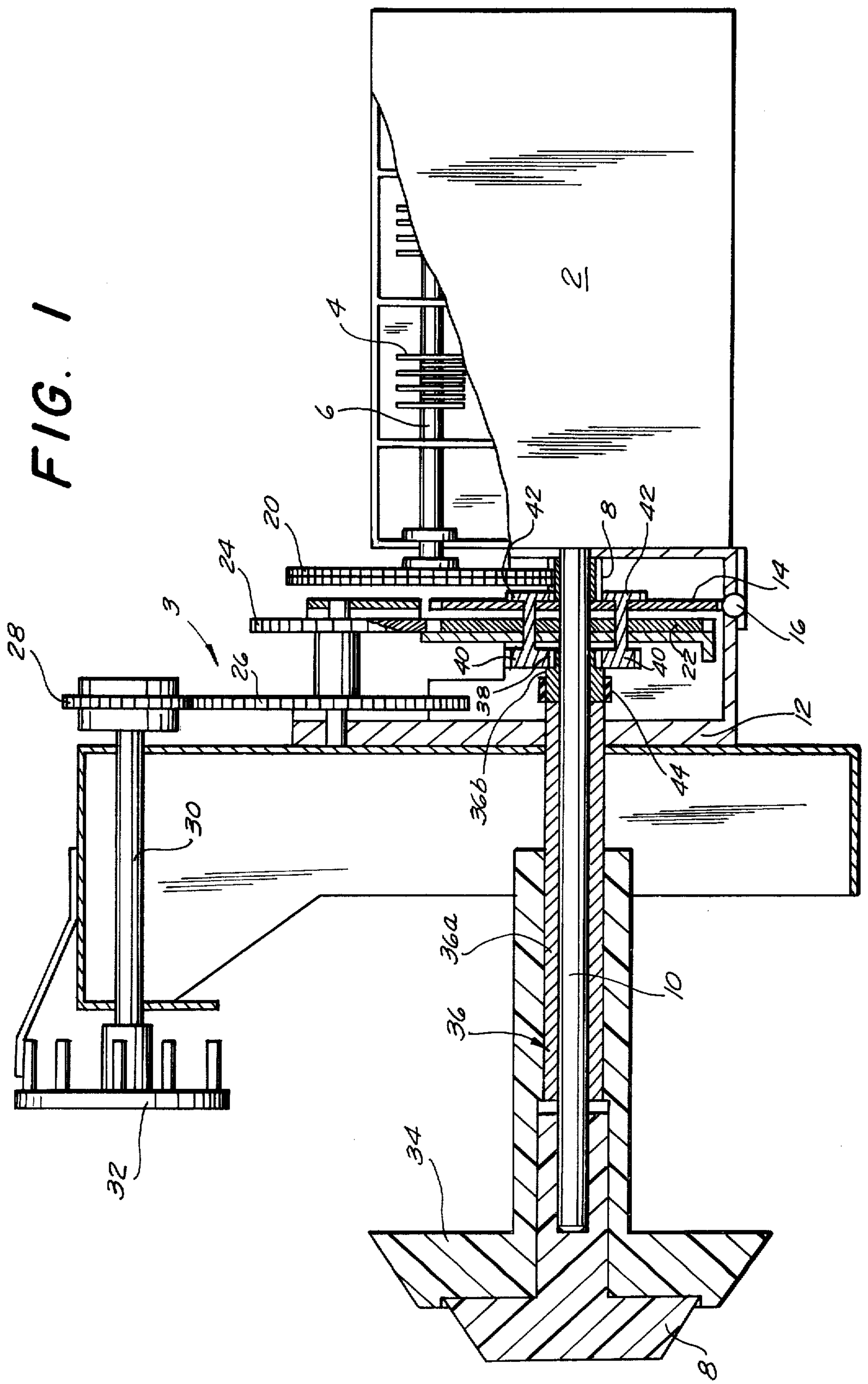
FIG. 1 is a side cross-sectional view of a typical variable-condenser type UHF tuner embodying the present invention.
Figures 2, 3:
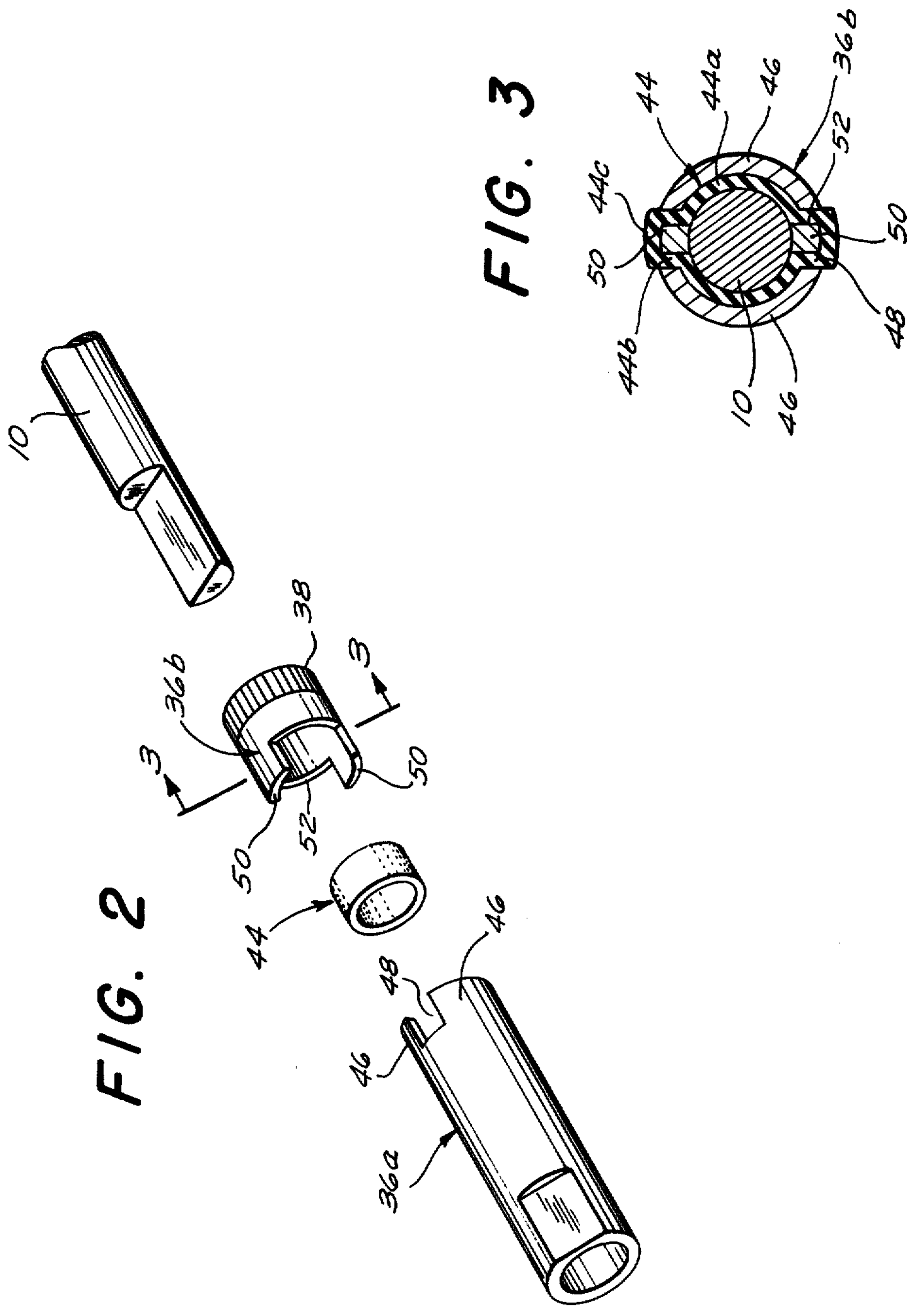
FIG. 2 is a three-quarter perspective exploded view of the shaft structure of the present invention.
FIG. 3 is an enlarged cross-sectional view of the assembled shaft structure of FIG. 2, taken along the line 3—3 of FIG. 2.

FIG. 1 discloses a typical UHF tuner having both coarse and fine tuning capabilities, in which the present invention is embodied. The tuner proper, generally designated 2, is of the variable condenser type, comprising rotary condenser plates 4 mounted on shaft 6 for rotation with the latter to variably overlap stator plates (not shown) in order to provide the desired tuning effect. This type of tuner is well-known, and needs no further description.

For providing coarse tuning (channel selection) a coarse tuning knob 8 is made fast to coarse tuning shaft 10 which passes through a supporting wall 12 of the tuner structure and is provided, fast thereon, with a detent wheel 14 which cooperates with spring urged detent ball 16 in conventional fashion. Pinion gear 18 is frictionally mounted on the end of coarse tuning shaft 10 and meshes with gear 20 fast on the shaft 6 of the tuning element 2. Hence as the coarse tuning knob 8 is rotated, the detent wheel 14 provides for step-by-step rotation thereof and consequent step-by-step rotation of the shaft 6 of the tuning element 2, thereby to tube the TV set from one selected channel to the next. Also fast on shaft 10 is a gear 22 which meshes with gear 24, the latter rotating gear 26 which meshes with and rotates gear 28, the latter, through shaft 30, moving a channel number display member 32, thereby to indicate to the user of the set the identification of the particular channel to which the set is tuned.

For fine tuning, in this exemplary tuner, a fine tuning knob 34 is provided which is fast on shaft 36, the shaft 36 being rotatably coaxially mounted on the coarse tuning shaft 10. At its right hand end the fine tuning shaft 36 carries a gear 38 which meshes with planetary gears 40 carried by the gear 22 and detent wheel 14, planetary gears 42 rotating with the gears 40 and meshing with the gear 18. Hence, while the coarse tuning shaft 10 is stationary, if the fine tuning knob 34 and shaft 36 are rotated, that rotation will be transmitted via gears 38, 40 and 42 to the gear 18, causing that gear 18 to slip and rotate relative to the coarse tuning shaft 10, thereby adding an increment of rotation to the shaft 6 of the tuning element 2 to provide a fine tuning adjustment. The detent ball 16 acting on the detent wheel 14 holds the coarse tuning shaft 10 stationary during this fine tuning operation.

When coarse tuning is effected, and particularly when a detent operation is involved, shaft rotation starts and stops rapidly. As the shaft 10 rotates the planetary gears 40 and 42 are moved around the axis of the shaft 10, and since the planetary gears 42 move rotationally with the gear 18 they do not tend to rotate about their own axes. Consequently the planetary gears 40 tend to rotate the fine tuning shaft 36 along with the coarse tuning shaft 10, a desirable result, since if the two shafts rotate together to the same degree there will be no change in fine tuning adjustment from one channel to another. However, because of inertial and frictional effects, there is a tendency on the part of the fine tuning shaft 36 and its associated knob 34 to lag behind the coarse tuning shaft 10 or to move ahead of the coarse tuning shaft 10, depending upon the vagaries of the accelerational movements of the shaft 10. This results in an undesired shifting of the fine tuning adjustment each time that the channel selector or coarse tuning shaft 10 is actuated.

In order to minimize, if not completely eliminate, that effect, and in accordance with the present invention, fine tuning shaft 36 is divided into two sections 36*a* and 36*b*. The section 36*a* is connected to the fine tuning knob 34 so as to be driven thereby. The shaft section 36*b* is connected to the gear 38 so as to drive the latter. Interposed between the two sections is a cushioning resilient driving member 44, the shaft section 36*a* driving the shaft section 36*b* through the intermediation of the member 44. In the form here specifically disclosed the right band or driving end of the shaft section 36*a* is provided with a pair of finger-like protrusions 46 separated by gaps 48, and the driven end of the shaft section 36*b* is provided with a plurality of axially projecting finger-like portions 50 separated by circumferential gaps 52. The fingers 50 fit within the gaps 48 and the fingers 46 fit within the gaps 52 in an interdigitated manner, with circumferential clearance therebetween. The resilient cushion member 44 as here specifically disclosed is in the form of a sleeve loosely mounted on the inner coaxial coarse tuning shaft 10 radially inside the fingers 46, other portions 44*b* of the sleeve 44 extending radially outwardly through the circumferential spaces between the fingers 46 and 50 respectively, and a third portion 44*c* of the sleeve 44 extending circumferentially outside the fingers of one pair, here shown as the fingers 50. Hence when the shaft section 36*a* is rotated by the knob 44 that rotation will be transmitted to the shaft section 36*b* and the gear 38 integrally formed therewith through the sections 44*b* of the sleeve 44, thereby to effect the desired degree of fine tuning. Moreover, when channel selection is effected through detented rotation of the coarse tuning shaft 10, the fine tuning shaft 36 and the fine tuning knob 34 will rotate accurately with the coarse tuning shaft 10 and the coarse tuning knob 8, the resilient cushioning member 44 absorbing and compensating for inertial and frictional misalignment tendencies.

The resilient cushioning member 44 may be formed of rubber or rubberized packing material. It likewise may be formed of any other relatively resilient material capable of returning reliably to its original shape and size after distorting forces have been applied thereto.

While the present invention has been disclosed in connection with one particular design of tuner, especially adapted for UHF tuning, it will be appreciated that this is by way of example only, and that many variations may be made in that aspect of the disclosure. Likewise, the particular structure disclosed for coupling the two fine tuning shaft sections 36*a* and 36*b*, while preferred, is but exemplary only, and many other structural modifications could be made therein, all without departing from the spirit of the invention as defined in the following claims.

We claim:

1. In a tuner comprising a tuning element, a coarse tuning input member, a fine tuning input member, and means operatively connecting said members and said element so that actuation of either member causes movement of said element and actuation of said coarse tuning input member also causes movement of said fine tuning input member; the improvement which comprises said connecting means between said fine tuning input member and said element comprises a first section operatively connected to said fine tuning input member to be driven thereby, a second section operatively connected to said element to drive the latter, and a resilient force-transmitting member drivingly interposed between said sections, whereby the position of said fine tuning input member relative to said coarse tuning input member does not shift appreciably when the latter is moved.

2. The tuner of claim 1, in which said first and second sections are rotatable and comprise circumferentially arranged projecting parts which respectively interfit, and said resilient member is circumferentially interposed between said parts.

3. The tuner of claim 1, in which said first and second sections are coaxially rotatably mounted on a shaft and each comprise generally axially extending projecting parts which are circumferentially arranged and respectively interfit, said resilient member being mounted on said shaft and having portions extending between said parts.

4. The tuner of claim 3, in which said shaft comprises a part of said coarse tuning input member.

5. The tuner of claim 3, in which said resilient means comprises a first portion located radially inside the projecting parts on one of said sections and a second portion of which is located radially outside the projecting parts on the other of said sections, said first and second portions being connected by said portions extending between said parts.

6. The tuner of claim 5, in which said shaft comprises a part of said coarse tuning input member.

7. The tuner of claim 1, in which said second section is rotatable and comprises an integrally formed gear drivingly connected to said element.

8. The tuner of claim 7, in which said first section is rotatable and said sections respectively comprise interfitting circumferentially arranged projecting parts which respectively interfit, and said resilient member is circumferentially interposed between said parts.

9. The tuner of claim 8, in which said first and second sections are coaxially rotatably mounted on a shaft.

10. The tuner of claim 9, in which said shaft comprises a part of said coarse tuning input member.

11. The tuner of claim 9, in which said resilient means comprises a first portion located radially inside the projecting parts on one of said sections and a second portion of which is located radially outside the projecting parts on the other of said sections, said first and second portions being connected by said portions extending between said parts.

12. The tuner of claim 11, in which said shaft comprises a part of said coarse tuning input member.

* * * * *